United States Patent
Deutsch et al.

(10) Patent No.: US 6,796,235 B2
(45) Date of Patent: Sep. 28, 2004

(54) CHEMICAL IMAGING OF A LITHOGRAPHIC PRINTING PLATE

(75) Inventors: Albert S. Deutsch, Hartsdale, NY (US); Bruce R. Harrison, Hollis, NH (US)

(73) Assignee: Maxryan Enterprises, Inc., Tampa, FL (US)

(*) Notice: Subject to any disclaimer, the term of this patent is extended or adjusted under 35 U.S.C. 154(b) by 0 days.

(21) Appl. No.: 09/941,304

(22) Filed: Aug. 29, 2001

(65) Prior Publication Data

US 2002/0054981 A1 May 9, 2002

Related U.S. Application Data

(62) Division of application No. 09/566,455, filed on May 8, 2000, now Pat. No. 6,315,916.

(51) Int. Cl.⁷ .............................................. B41N 1/08
(52) U.S. Cl. ........................................ 101/456; 101/457
(58) Field of Search .............................. 101/456, 457, 101/462, 463.1, 465, 466, 467; 347/96, 102, 105, 106; 430/302

(56) References Cited

U.S. PATENT DOCUMENTS

| | | | |
|---|---|---|---|
| 2,063,631 A | 12/1936 | Schmidt et al. | 534/564 |
| 2,667,415 A | 1/1954 | Neugebauer et al. | 430/302 |
| 2,679,498 A | 5/1954 | Seven et al. | 534/564 |
| 3,050,502 A | 8/1962 | Mellan | 528/236 |
| 3,163,633 A | 12/1964 | Steppan et al. | 534/564 |
| 3,227,074 A | 1/1966 | Lareau | 101/132 |
| 3,311,605 A | 3/1967 | Steppan et al. | 534/564 |
| 3,406,159 A | 10/1968 | Steppan et al. | 534/564 |
| 3,479,185 A | 11/1969 | Chambers, Jr. | 96/84 |
| 3,561,961 A | 2/1971 | Blake | 430/264 |
| 3,615,567 A | 10/1971 | Wilson | 96/90 |
| 3,716,390 A | 2/1973 | Whitby | 216/41 |

(List continued on next page.)

FOREIGN PATENT DOCUMENTS

| | | |
|---|---|---|
| GB | 1 431 462 | 4/1976 |
| JP | 06008413 A | 1/1994 |
| JP | 06014165 A | 1/1994 |

(List continued on next page.)

OTHER PUBLICATIONS

J. Konar, Light Sensitive Systems, 1965, J. Wiley & Sons, NY, pp. 338–353.
Allen et al., Eur. Polym. J., vol. 21, No. 10, 1985, pp. 841–848.

Primary Examiner—Stephen R. Funk
(74) Attorney, Agent, or Firm—Hayes Soloway P.C.

(57) ABSTRACT

A process for imaging a lithographic printing plate having a coating containing diazo resins. An ink jet printer is used to apply micro drops of a basic chemical solution that insolubilizes the affected areas of the coating to a developing solution. The latent image may be cured by heating the plate for a short period, and is then developed. The process works with conventional, commercially available lithographic plates and developers.

6 Claims, 2 Drawing Sheets

U.S. PATENT DOCUMENTS

| | | | |
|---|---|---|---|
| 3,785,825 A | 1/1974 | Deutsch et al. ................. 96/75 |
| 3,849,392 A | 11/1974 | Steppan ...................... 534/560 |
| 3,870,435 A | 3/1975 | Watanabe et al. .......... 117/36.2 |
| 3,910,187 A | 10/1975 | Cords ......................... 101/450 |
| 4,003,312 A | 1/1977 | Gunther ...................... 101/466 |
| 4,007,047 A | 2/1977 | Kaplan et al. ................. 96/36 |
| 4,072,528 A * | 2/1978 | Bratt ....................... 430/273.1 |
| 4,104,070 A | 8/1978 | Moritz et al. .................. 96/36 |
| 4,186,069 A | 1/1980 | Muzyczko et al. .......... 430/175 |
| 4,224,398 A | 9/1980 | Muzyczko et al. .......... 430/175 |
| 4,258,367 A | 3/1981 | Mansukhani ............... 346/1.1 |
| 4,273,851 A | 6/1981 | Muzyczko et al. .......... 430/175 |
| 4,288,520 A | 9/1981 | Sprintschnik et al. ....... 430/169 |
| 4,292,388 A * | 9/1981 | Ikeda et al. ................. 430/162 |
| 4,299,907 A | 11/1981 | Burkle et al. ............... 430/175 |
| 4,303,924 A | 12/1981 | Young, Jr. ................... 346/1.1 |
| 4,356,254 A | 10/1982 | Takahashi et al. .......... 430/296 |
| 4,382,262 A | 5/1983 | Savit ......................... 346/1.1 |
| 4,436,804 A | 3/1984 | Walls ......................... 430/157 |
| 4,443,820 A | 4/1984 | Mutoh et al. ............... 358/296 |
| 4,511,640 A | 4/1985 | Liu ............................. 430/157 |
| 4,668,533 A | 5/1987 | Miller ......................... 427/98 |
| 4,833,486 A | 5/1989 | Zerillo ........................ 346/1.1 |
| 4,857,143 A | 8/1989 | Glenning et al. ........... 156/668 |
| 4,917,988 A | 4/1990 | Koizumi et al. ............. 430/169 |
| 4,927,741 A | 5/1990 | Garth et al. ................. 430/309 |
| 5,032,216 A | 7/1991 | Felten ........................ 156/628 |
| 5,114,744 A | 5/1992 | Cloutier et al. ............... 427/96 |
| 5,154,121 A | 10/1992 | Schneider ................ 101/401.1 |
| 5,156,089 A | 10/1992 | McCue et al. ............. 101/128.4 |
| 5,209,814 A | 5/1993 | Felten et al. ................ 156/628 |
| 5,270,078 A | 12/1993 | Walker et al. .............. 427/264 |
| 5,270,368 A | 12/1993 | Lent et al. .................. 524/236 |
| 5,312,654 A | 5/1994 | Arimatsu et al. ........... 427/511 |
| 5,316,892 A | 5/1994 | Walls et al. ................. 430/309 |
| 5,380,769 A * | 1/1995 | Titterington et al. .......... 347/96 |
| 5,431,723 A | 7/1995 | Bermes et al. ............. 106/22 K |
| 5,466,653 A | 11/1995 | Ma et al. .................... 503/200 |
| 5,495,803 A | 3/1996 | Gerber et al. ............ 101/401.1 |
| 5,501,150 A | 3/1996 | Leenders et al. ........... 101/466 |
| 5,514,522 A | 5/1996 | Fitzgerald et al. ....... 430/284.1 |
| 5,516,620 A | 5/1996 | Cheng et al. ............... 430/138 |
| 5,556,924 A | 9/1996 | Fitzgerald et al. .......... 525/293 |
| 5,599,650 A | 2/1997 | Bi et al. .................... 430/273.1 |
| 5,607,816 A | 3/1997 | Fitzgerald et al. ....... 430/271.1 |
| 5,620,822 A | 4/1997 | Kato et al. .................... 430/49 |
| 5,621,448 A | 4/1997 | Oelbrandt et al. ............ 347/96 |
| 5,637,426 A | 6/1997 | Uchikawa ...................... 430/9 |
| 5,662,039 A | 9/1997 | Watanabe et al. ........... 101/116 |
| 5,677,108 A | 10/1997 | Chia et al. ................. 430/273.1 |
| 5,677,110 A | 10/1997 | Chia et al. .................. 430/302 |
| 5,688,627 A | 11/1997 | Deutsch ..................... 430/157 |
| 5,695,908 A | 12/1997 | Furukawa ................... 430/205 |
| 5,738,013 A | 4/1998 | Kellett ...................... 101/463.1 |
| 5,750,314 A | 5/1998 | Fromson et al. ............ 430/302 |
| 5,795,698 A | 8/1998 | Fitzgerald et al. .......... 430/302 |
| 5,811,220 A | 9/1998 | Cheng et al. ............... 430/302 |
| 5,819,653 A | 10/1998 | McCue .................. 101/128.21 |
| 5,820,932 A | 10/1998 | Hallman et al. ............. 427/261 |
| 5,849,066 A | 12/1998 | Kellett .................... 106/31.13 |
| 5,849,462 A | 12/1998 | Li et al. ................... 430/283.1 |
| 5,852,795 A | 12/1998 | Neumann et al. ............. 702/98 |
| 5,852,975 A | 12/1998 | Miyabe et al. ............ 101/463.1 |
| 5,857,410 A | 1/1999 | Watanabe et al. ........... 101/116 |
| 5,878,662 A | 3/1999 | McCue .................... 101/128.4 |
| 5,878,664 A | 3/1999 | Hartka ....................... 101/216 |
| 5,889,084 A | 3/1999 | Roth ........................... 523/161 |
| 5,900,345 A | 5/1999 | Platzer et al. ............... 430/156 |
| 5,910,395 A | 6/1999 | Li et al. ...................... 430/302 |
| 5,925,497 A | 7/1999 | Li et al. ................... 430/278.1 |
| 5,966,154 A | 10/1999 | DeBoer ....................... 347/82 |
| 5,970,873 A | 10/1999 | DeBoer et al. ............. 101/466 |
| 5,992,322 A | 11/1999 | Fromson et al. ............ 101/457 |
| 5,997,993 A | 12/1999 | Bi et al. ..................... 428/195 |
| 6,014,931 A | 1/2000 | Fromson et al. ............ 101/465 |
| 6,019,045 A | 2/2000 | Kato et al. .................. 101/466 |
| 6,020,397 A | 2/2000 | Matzinger ................... 523/160 |
| 6,025,022 A | 2/2000 | Matzinger ................... 427/256 |
| 6,027,857 A | 2/2000 | Li et al. ................... 430/283.1 |
| 6,044,762 A | 4/2000 | DeBoer et al. ............. 101/466 |
| 6,132,514 A | 10/2000 | Srinivasan et al. ......... 101/466 |
| 6,187,380 B1 | 2/2001 | Hallman et al. ............. 427/261 |
| 6,315,916 B1 | 11/2001 | Deutsch et al. ............... 216/83 |
| 6,344,306 B1 * | 2/2002 | Fujiyoshi et al. ............ 101/457 |
| 6,403,277 B1 * | 6/2002 | Sweet et al. ................ 430/146 |
| 2002/0126189 A1 * | 9/2002 | Gloster ....................... 347/100 |

FOREIGN PATENT DOCUMENTS

| | | |
|---|---|---|
| JP | 06166162 A | 6/1994 |
| JP | 07108667 A | 4/1995 |
| JP | 07205563 A | 8/1995 |
| JP | 08290543 A | 11/1996 |
| JP | 08324145 A | 12/1996 |
| JP | 09029926 A | 2/1997 |
| JP | 09058144 A | 3/1997 |
| JP | 09118003 A | 5/1997 |
| JP | 09258458 A | 10/1997 |
| JP | 10010709 A | 1/1998 |
| JP | 10016176 A | 1/1998 |
| JP | 10024549 A | 1/1998 |
| JP | 10067087 A | 3/1998 |
| JP | 10076624 A | 3/1998 |
| JP | 10076625 A | 3/1998 |
| JP | 10157053 A | 6/1998 |
| JP | 10202822 A | 8/1998 |
| JP | 10203039 A | 8/1998 |
| JP | 10204354 A | 8/1998 |
| JP | 10204356 A | 8/1998 |
| JP | 10219163 A | 8/1998 |
| JP | 10219164 A | 8/1998 |
| JP | 10251580 A | 9/1998 |
| JP | 10259336 A | 9/1998 |
| JP | 10259338 A | 9/1998 |
| JP | 10265726 A | 10/1998 |
| JP | 10272753 A | 10/1998 |
| JP | 10273611 A | 10/1998 |
| JP | 10273612 A | 10/1998 |
| JP | 10273614 A | 10/1998 |
| JP | 10279867 A | 10/1998 |
| JP | 10296945 A | 11/1998 |
| JP | 10298472 A | 11/1998 |
| JP | 10298473 A | 11/1998 |
| JP | 10298479 A | 11/1998 |
| JP | 10315617 A | 12/1998 |
| JP | 10315645 A | 12/1998 |
| JP | 10316916 A | 12/1998 |
| JP | 10316917 A | 12/1998 |
| JP | 10316920 A | 12/1998 |
| JP | 10324833 A | 12/1998 |
| JP | 10324834 A | 12/1998 |
| JP | 2000-225677 * | 8/2000 |

* cited by examiner

CHEMICAL IMAGING OF A LITHOGRAPHIC PRINTING PLATE

This application is a divisional application of U.S. application Ser. No. 09/566,455 filed May 8, 2000, now U.S. Pat. No. 6,315,916.

BACKGROUND OF THE INVENTION

This invention relates to a process for imaging a lithographic printing plate, and more particularly to a process for using an ink jet printer to imagewise apply an insolublizing chemical to a lithographic printing plate having a coating containing diazo compounds.

In the art of lithographic printing it is generally required that one or more lithographic printing plates be mounted on a printing press. The lithographic printing plate is characterized by having on its printing surface oleophilic ink receiving areas in the form of the image to be printed, and hydrophilic water receiving areas corresponding to the other, non-printing areas of the surface. Because of the immiscibility of oil-based lithographic inks and water, on a well-prepared printing plate, ink will fully coat the oleophilic areas of the plate printing surface and not contaminate the hydrophilic areas. The operating press brings the inked plate surface into intimate contact with an impression cylinder or elastic transfer blanket that transfers the ink image to the media to be printed.

Traditionally, a lithographic plate is photographically imaged. The plate substrate is most commonly aluminum, treated so that the printing surface is hydrophilic, although treated or untreated plastic or paper substrates can also be used. The hydrophilic substrate is then coated with one or more layers of polymer or resin solutions. The deposited coating is generally oleophilic, although the coating solution may be aqueous-based or solvent-based. A coating deposited from an aqueous-based coating solution is known as aqueous-borne; from a solvent-based solution, solvent-borne. Coating layer thickness are commonly about 1 to 3 microns thick.

At least one of the layers of the plate coating is photosensitive. Light sensitive coating compositions for lithographic printing plates are well known in the art as taught in U.S. Pat. Nos. 4,511,640; 4,917,988; 3,785,825; 4,186,069; 4,224,398; 4,273,851; 4,288,520; 4,299,907 and 5,688,627, and are incorporated herein by reference. The photosensitive layer most commonly comprises diazo resins. Diazo resin coatings can be prepared such that the diazo functional groups undergo photochemically initiated cross-linking reactions on exposure to light typically having wavelengths from 325 to 400 nm. The photochemical reaction products are generally acidic, effectively reducing the pH in the imaged area of the coating. Alternative photosensitive layers comprise diazo compounds mixed with non-photosensitive polymers or resins, or other photosensitive polymers without diazo compounds. The plate thus prepared is considered photographically presensitized (PS).

Even when other photochemically-active polymers are used to impart photosensitivity to the coating, some amount of diazo resin may be added to the coating solution to promote adhesion between the coating and the aluminum surface or to act as a binder for the coating. Such a plate would be considered presensitized based on the photosensitizing polymers contained even if the diazo compounds contained were not in themselves sufficient to impart imaging capability.

To prepare a PS plate for printing, the plate is first exposed to light in the pattern to be printed using a film negative. The exposed plate is then washed in a developing solution. The exposed areas of the plate coating are insoluble; the unexposed areas are dissolved and quantitatively removed from the hydrophilic aluminum surface of the plate substrate. Such a preparation process is referred to as a negative working process because the unexposed coating is removed. In a positive working process, the pattern to be printed is masked and the photosensitive exposed coating is rendered soluble in a developer. Until after the development step, the printing artisan or press operator generally endeavors to not allow incidental exposure of the plate to typical white light or sunlight. Undeveloped plates are typically only handled in low light or "yellow light" rooms or conditions.

The insolubility of the exposed coating is typically caused by photochemically induced cross-linking of the diazo resins. Plates relying on photopolymers comprising photosensitive functional groups other than diazo functional group may be oxygen sensitive. In such a case, the rate of cross-linking may be enhanced by an oxygen inhibition barrier layer over the photosensitive layer.

Lithographic printing plates generally have images that are planographic, i.e., substantially flat. But other printing plates with similar photosensitive coatings may have raised images for relief printing or intaglio images for gravure printing. Lithographic printing processes may use water as described above, or they may use a waterless printing technique. If a waterless technique is used, then the discrimination between the inked and non-inked areas of the plate surface is based on having different surface energies in the coated and non-coated areas.

Traditionally, lithographic plates are imaged by photographic transfer from original artwork. This process is labor-intensive and costly. Hence with the advent of the computer engendering a revolution in the graphics design process preparatory to printing, there have been extensive efforts to pattern printing plates, in particular lithographic printing plates, directly using a computer-controlled apparatus such as a platesetter which is supplied with digital data corresponding to the image to be printed. A platesetter has the capability to supply an image forming agent, typically light energy or one or more chemicals, to a plate according to various images as defined by digital data, i.e., to imagewise apply an image forming agent. Specially manufactured lithographic plates may be required for certain types of platesetters. Such a combination of a computer-controlled platesetter and the proprietary plates used with them along with developer solutions and any other materials or apparatuses necessary to prepare the plates for printing is known as a computer-to-plate (CTP) system.

Heretofore, many of the new CTP systems have been large, complex, and expensive. They are designed for use by large printing companies as a means to streamline the prepress process of their printing operations and to take advantage of the rapid exchange and response to the digital information of graphic designs provided by their customers. There remains a strong need for an economical and efficient CTP system for the many smaller printers who utilize lithographic printing.

Many of the new CTP systems use light sources, typically lasers, to directly image PS plates. But using lasers to image plates is very expensive, because the per-unit cost of the lasers is high and because they require sophisticated focusing optics and electronic controls. If because of the cost only a single laser is used, then time becomes a constraint because of the necessity of raster scanning.

In recent years, ink jet printers have replaced laser printers as the most popular hard copy output printers for computers.

Ink jet printers have several competitive advantages over laser printers. One advantage is that it is possible to manufacture an array of 10's or even 100's of ink jet nozzles spaced very closely together in a single inexpensive printhead. This nozzle array manufacturing capability enables fast printing ink jet devices to be manufactured at a much lower cost than laser printers requiring arrays of lasers. And the precision with which such a nozzle array can be manufactured and the jetting reliability of the incorporated nozzles means that these arrays can be used to print high quality images comparable to photo or laser imaging techniques. Ink jet printers are increasingly being used for prepress proofing and other graphic arts applications requiring very high quality hard copy output. In spite of the large and rapidly growing installed base of ink jet printers for hard copy output, ink jet printing technology is not commonly used in CTP systems. There are many challenging technical requirements facing the practitioner who would design such an ink jet based CTP system as can be seen in the prior art.

A first requirement is that the ink jet ink used to image the printing plate be jettable, able to form ink drops of repeatable volume and in an unvarying direction. Further, for practical commercial application, the ink must have a long shelf life, in excess of one year or more. U.S. Pat. No. 5,970,873 (DeBoer et al) describes the jetting of a mixture of a sol precursor in a liquid to a suitably prepared printing substrate. But any ink constituents of limited solubility will render unlikely the practical formulation of a jettable, shelf-stable ink. Similar problems exist in U.S. Pat. No. 5,820,932 (Hallman et al) in which complex organic resins are jetted, and U.S. Pat. No. 5,738,013 (Kellet) in which marginally stable transition metal complexes are jetted.

Another requirement is that to be of wide utility, the ink jet based CTP system be able to prepare printing plates with small printing dots, approximately 75 microns in diameter or smaller, so that high resolution images can be printed. Ink jet printers can produce such small dots, but of those having substantial commercial acceptance, only ink jet printers employing aqueous-based inks are practically capable of printing such small dots. Thus the systems described in U.S. Pat. No. 4,003,312 (Gunther), U.S. Pat. No. 5,495,803 (Gerber), U.S. Pat. No. 6,104,931 (Fromson et al), and U.S. Pat. No. 6,019,045 (Kato) which use solvent-based hot melt inks will not allow the preparation of the high resolution printing plates necessary for printed images of high quality. It is also required that the prepared printing plates be rugged, capable of sustaining press runs of many thousands of impressions. The waxes used in the hot melt inks described in U.S. Pat. No. 6,019,045 (Kato) and U.S. Pat. No. 4,833,486 (Zerillo) would wear out in such a long press run.

Another requirement of a successful ink jet based CTP system is that a mature plate technology is to be preferred. There are many tradeoffs in the manufacture of commercially practical lithographic plates. They must be highly sensitive to the imaging process and yet thermally stable, stable in high humidity storage environments and yellow light, resistant to fingerprints, of minimal toxicity and environmentally benign, easily developed in that small dots are quantitatively resolved without dot blooming using developers that are of minimal toxicity and environmentally benign, able to sustain long press runs, manufacturable at a low cost per square foot, and many other practical requirements. U.S. Pat. No. 5,695,908 (Furukawa) describes a process for preparing a printing plate comprising a new plate coating containing a water-soluble polymer that becomes water-insoluble in contact with a metal ion in a solution jetted imagewise. But such a new plate coating is unlikely to meet the wide array of constraints on a successful plate technology. U.S. Pat. No. 6,025,022 (Matzinger) describes a new plate coating on a glass substrate that would be unlikely to find wide acceptance.

SUMMARY OF THE INVENTION

The present invention provides a process for preparing lithographic plates by ink jet imaging of presensitized plates comprising diazo compounds. According to this inventive process, an alkaline or chemically basic ink comprising one or more suitable pH elevating chemicals is imagewise jetted onto a lithographic plate having a coating comprising diazo compounds. The latent image on the plate is cured by heating, and next developed by washing with a conventional chemical development solution. The plate is then ready to be mounted and used in a conventional lithographic press. Accordingly, there are several objects and advantages of the present invention.

The present invention is easily embodied in a practical ink-jet-based CTP system in that there are minimal constraints on the formulation of the imaging ink, and in that widely-available commercially-accepted lithographic plates with desirable aluminum substrates and their corresponding development solutions can be used without modification. A plate prepared by the present invention is functionally similar to a plate prepared by photographic imaging, with a potential long run life but without the complexity, cost, or waste of a film negative. The plate can be prepared quickly, in that fewer steps are required and in that a speedy ink jet printer can be employed, and yet the plate image is of high resolution, enabling high quality 4-color printing. Further, the plate thus prepared is storage stable, little subject to contamination in its hydrophilic areas and can be used on a wide variety of commercially available and accepted printing presses. The formulation of the insolubilizing ink is flexible and can be simple, inexpensive to manufacture, environmentally safe, and non-toxic. That such a simply and flexibly formulated ink can be jetted in very small diameter drops to produce high resolution images on conventional and widely accepted presensitized plates containing diazo resins is a unique and surprising result.

Still other objects and advantages will become apparent from the claims, and from a consideration of the ensuing detailed description of the invention.

DETAILED DESCRIPTION OF THE INVENTION

Figure 1:
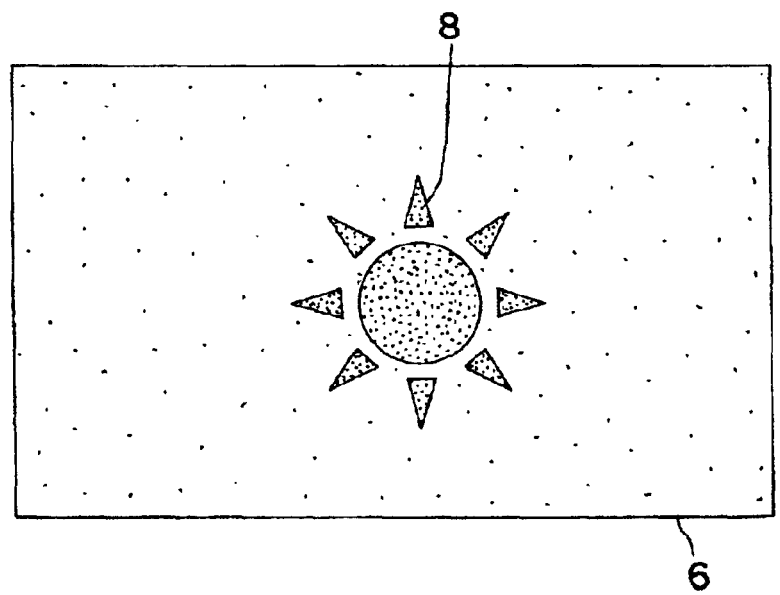
FIG. 1 is a plan view of a printing plate before development, containing a latent image according to the invention, and after development, with only the imaged coating remaining.
Figure 1:
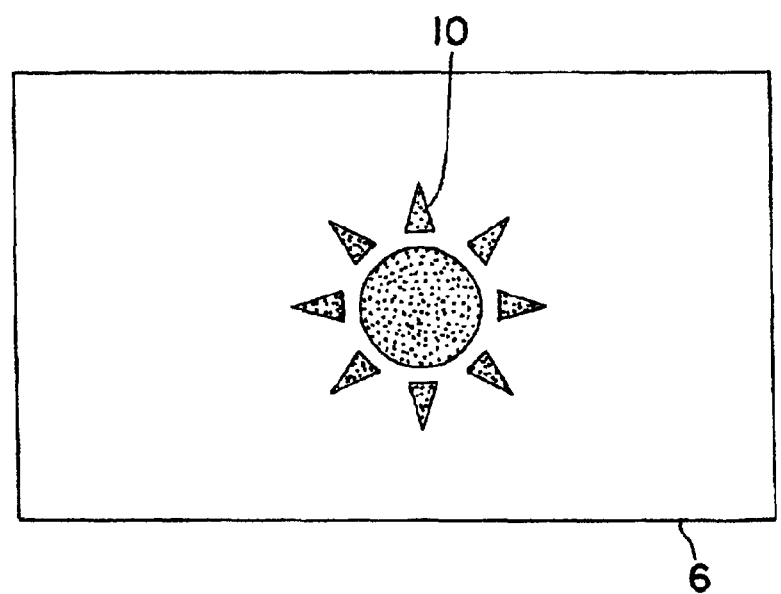

FIG. 1 depicts a presensitized plate 6 with a latent image 8 according to the invention. The latent image 8 in the coating of plate 6 is created by imagewise application of a chemical that causes the affected area of the coating to become insoluble in the developing solution. It is simplest and preferred to formulate an "ink" solution comprising the insolubilizing chemical, and to use an ink jet printer for the imagewise application of the insolubilizing solution.

After application of the insolubilizing chemical, the plate 6 is preferably heated to between 90 to 130° C. for from 15 seconds to 3 minutes, or most preferably to about 120° C. for about 2 minutes for the purposes of curing the latent image and to drive the insolubilization reaction to completion. After heating, the plate 6 is developed either by hand or preferably with a conventional developing processor using a conventional developing solution to produce the image 10.

Figure 2:
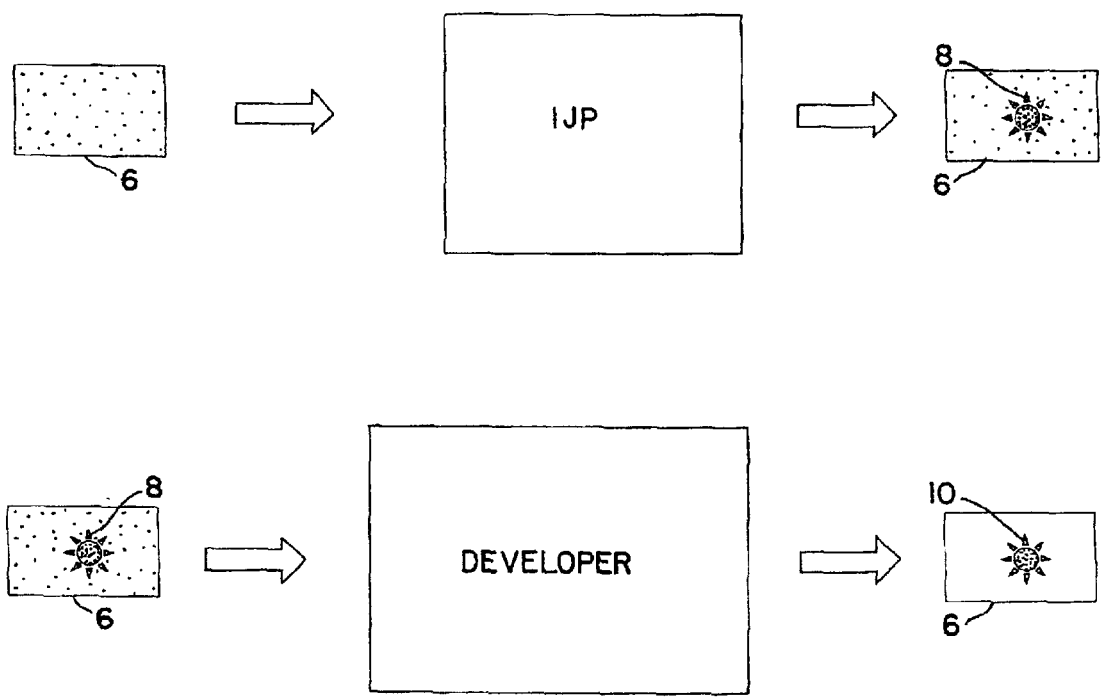
FIG. 2 depicts the process flow of a computer-to-plate system according to the invention.

FIG. 2 depicts a computer-to-plate system comprising an ink jet printer IJP and a conventional developing processor DEVELOPER according to a preferred embodiment of the invention. In the most preferred embodiment, the ink jet printer used is a commercially available drop-on-demand printer capable of printing small ink drops having volumes no larger than 8 picoliters (8 pl) such as the EPSON [Stylus Color] STYLUS COLOR 3000 ink jet printer available from Epson America, Inc., Long Beach, CA. However, the great flexibility available to the practitioner in formulating an insolubilizing ink according to the invention means that a well-performing jettable solution can be formulated such that the printhead of almost any ink jet printer will be able to form regular drops with good reliability.

The insolubilizing ink applied to the PS plate reacts directly with the diazo resins or diazo-containing compounds in the affected areas of the coating to form an insoluble product. The printed areas preferably exhibit a slight color change, which may be as a result of a chemical reaction between the insolubilizing solution and the diazo resins of the plate, or which may be the result of an indicator dye added to the insolubilizing solution for the purpose of enabling inspection of the imaged plate before development. When the plate is processed or washed with the developing solution, the unprinted areas of the coating are quantitatively dissolved, leaving the hydrophilic-treated aluminum bare, and the printed areas coating are apparently undisturbed.

The imaging ink comprises a liquid vehicle, typically water, and one or more pH-elevating agents typically of low molecular weight such as sodium carbonate, sodium bicarbonate, lithium carbonate, sodium hydroxide, potassium hydroxide, sodium tetraboratedecahydrate, sodium pyrophosphatedecahydrate, sodium phosphate, sodium metasilicate, triethanol amine, or mixtures of such chemicals. In one embodiment, a mixture of sodium carbonate and sodium bicarbonate is used, with the proportions adjusted so that the pH is between 7.5 and 13.5, and more preferably from about 8.0 to 12.0. A dye compatible with the pH of the vehicle may also be added at a level of a few percent to enhance the visibility of the latent image. Although water is typically used, it is also possible to use for the ink vehicle other solvents such as methyl ethyl ketone, ethyl acetate, dimethyl formamide, acetone, simple alcohols, and other like chemicals or mixtures of such chemicals. In such a case, a lewis base would be added to elevate the basicity of the ink. Typically, the vehicle would comprise 30 to 100 precent of the imaging ink. A most preferred ink comprises water with 1 percent by weight dissolved sodium bicarbonate having a pH of about 8.3. That such a simply formulated alkaline ink can produce high quality imaging on conventional diazo containing plates is a unique and surprising result since it is common to use alkaline solutions as dissolving developer solutions for diazo-containing coated plates as seen in for example U.S. Pat No. 4,511,640 incorporated herein by reference.

For reliable jetting, and so that during idle periods the ink does not dry out in the ink jet nozzle causing it to clog, a humidifying co-solvent may be added to the insolubilizing ink. The co-solvent can be polyhydric alcohols such as glycerin, ethoxylated glycerin, ethylene glycol, diethylene glycol, triethylene glycol, propylene glycol, dipropylene glycol, or trimethylol propane, other high boiling point liquids such as pyrrolidone, methylpyrrolidone, or triethanol amine, other simple alcohols such as isopropyl alcohol or tertiary butyl alcohol, or mixtures of such solvents. When used, the co-solvent would typically comprise 5 to 70 percent of the ink.

The insolubilizing ink may contain one or more surfactants or wetting agents to control the surface tension of the ink, enhancing jettability, and to control the spread and penetration of the drop on the coated plate. The surfactants and wetting agents may include ICONOL DA, ICONOL NP, ICONOL OP. ICONOL TDA, SURFONYL TDA, SURFONYL TG-E, STRODEX, CAL-FAX, TERGITOL TMN, TERGITOL X, TERGITOL 15-S, IPA, Iso-butanol, and similar chemicals or mixtures of similar chemicals. When used, surfactants and wetting agents typically comprise 0.001 to 10 percent of the ink.

The insolubilizing ink may also contain one or more biocides to prolong the shelf life of the ink. Suitable biocides include for example GXL, PHENONIP, DXN, SODIUM OMADINE, KATHON PFM, CANGUARD 409, SUMQUAT 6020, and similar chemicals or mixtures of such chemicals. When used, the biocide would typically comprise 0.1 to 3 percent of the ink.

A typical formulation for an insoubilizing ink might comprise:

| | |
|---|---|
| Water with sufficient pH elevating agent to obtain desired pH | 70% |
| Co-solvent | 24% |
| Dye | 3% |
| Surfactant | 2% |
| Biocide | 1% |

To facilitate accurate imaging of the plate, the paper-handling or substrate-handling subsystem of ink jet printer should have a short, straight paper path. A printing plate is generally stiffer and heavier than the paper or media typically used in commercially available ink jet printers. If the plate fed into the printer mechanism must bend before or after being presented to the imaging printhead, then the movement of the plate through the printer may not be as accurate as the media for which the printer was designed. The most preferred EPSON STYLUS COLOR 3000 has such a short, straight paper path. A platen is preferably placed at the entrance to the paper feed mechanism. The platen supports the plate as it is pulled into the printer by the mechanism, facilitating the accurate transport of the plate under the imaging printhead.

Figure 3:
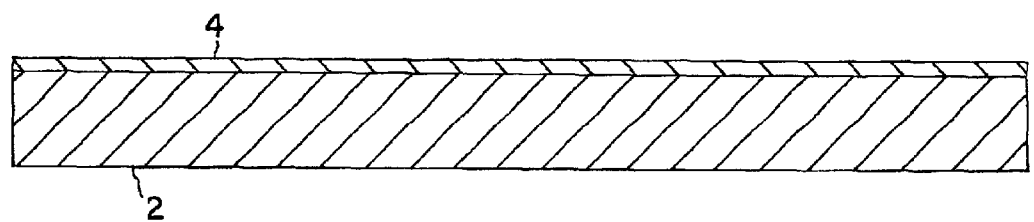
FIG. 3 is a cross-sectional view of a printing plate with single coating layer.

FIG. 3 is a cross-sectional view of a lithographic plate comprising an aluminum substrate 2 presensitized with a single layer coating 4. In a most preferred embodiment, the lithographic plate to be prepared for printing has a coating formed from an aqueous-borne diazo resin. Such plates are available from Precision Lithograining of South Hadley, Mass. Diazonium compounds are widely used in the preparation of photosensitive coatings for lithographic printing plates. The diazonium compounds typically used are of the structure A—$N_2$X with a covalent bond or A—$N_2^+$X⁻ with an ionic bond tending to enhance water solubility where A is an aromatic or heterocyclic residue and X is the anion of an acid. Specific examples of the synthesis of such compounds by the acid condensation of diazonium salts with active carbonyl compounds such as formaldehyde are given in U.S. Pat. No. 2,063,631 and U.S. Pat. No. 2,667,415, incorporated herein by reference. The preparation of higher molecular weight resins comprising many diazo functional groups is further described in U.S. Pat. Nos. 2,679,498; 3,050,502; 3,311,605; 3,163,633; 3,406,159; 3,277,074; 3,849,392; 4,299,907; 4,436,804; and U.S. Pat. No. 5,688,627 incorporated herein by reference.

Diazo resins in aqueous or solvent solution alone without other polymeric materials can be coated onto a suitably prepared aluminum plate. After imaging, such a plate would be washed with a lacquering developer, which in addition to dissolving the unexposed areas of the coating, deposits a protective organic coating on top of the insoluble diazo resins to increase the number of printing impressions possible before wearing the coating off the plate. Such a system of diazo-only coated plate and lacquering developer is known as an additive plate system.

Other aqueous or solvent coating solutions comprise, in addition to diazo resins, non-light-sensitive polymeric materials which act as binders and add wear resistance to the coating. To an aqueous coating solution, a latex dispersion may be added, although there are many other possible polymeric material additives for this purpose. In this case a non-lacquering developer is used on the imaged plate. Such a system is known as subtractive.

The resulting coating weight of diazo resins on a subtractive-coated plate is commonly in the range of 5 to 60% of the total dry coating weight. Subtractive coatings may optionally include other chemicals such as colorants, indicator dyes, surfactants, wetting agents, and plasticizers. Suitable colorants may include methylene blue, triphenylmethane dyes, copper phthalocyanines, halogenated copper phthalocyanines, rhodamine, calcozine, Victoria Blue, methyl violet, dioxazine, pigments such as those based on anthraquinone, and mixtures of any of these or like chemicals. When used, colorants are commonly present in the amount of from 1 to 35% of the coating weight.

Colorants are generally added to the coating for the purpose of enhancing the visibility of the latent and developed image on the plate. Such colorants do not substantially interfere with or absorb the light used to expose the plate when imaging as this would reduce the plate sensitivity and require that the exposure time be longer or that the light source be more powerful to maintain the same time of exposure. But according to the invention, it may be advantageous to deliberately include one or more dyes or pigments to reduce the light sensitivity of the plate. Because the invention does not depend on or require a light exposure imaging step, it may be advantageous to reduce or even eliminate the light sensitivity of the plate. Without being bound by theory, carefully selected colorants included in one or more layers of the coating may partially or wholly block the absorption of the imaging light by the diazo functional groups. This would be advantageous in that the press operator or printing artisan could handle the undeveloped plate in any ambient lighting condition without concern of unintended imaging or exposure. Colorants that may be useful for this purpose include but are not limited to Basic Yellow 1-CI 490, Basic Yellow 2-CI 41000, Acid Yellow 9-CI 13015, Acid Yellow 11-CI 18820, and BONJET CW-1, an aqueous dispersion of carbon black available from Orient Chemical Co.

Indicator dyes may be used to indicate the imaged areas of the coating after light exposure or chemical imaging according to the invention. Chemicals which may be useful for this purpose include 4-phenylazodiphenylamine, easin, azobenzene, CALCOZINE, Fuchsine dyes, Crystal Violet dyes, Methylene Blue dyes, and mixtures of these and similar chemicals. When used, indicator dyes are commonly present in amounts of from 0.01 to 0.35%.

Plates coated with solvent-borne photosensitive polymer solutions not containing photosensitizing diazo resins can also be prepared according to the invention if the jetted insolubilizing solution forms a well-defined dot on the coating without spreading excessively.

The following non-limiting examples serve to illustrate the invention.

EXAMPLE 1

Alkaline test solutions were prepared using 1% by weight of the following pH adjusting agent chemicals in water:

| Solution | pH Adj. Agent | Measured pH |
|---|---|---|
| A | Sodium Bicarbonate | 8.3 |
| B | Sodium Tetraborate-decahydrate | 9.0 |
| C | Sodium Pyrophosphatedecahydrate | 9.9 |
| D | Sodium Carbonate | 10.7 |
| E | Sodium Phophate | 11.4 |
| F | Sodium Metasilicatepentahydrate | 11.5 |
| G | Sodium Hydroxide | 11.6 |

Using a micropipet, microdrops of each solution were placed on a sample of a commercially available lithographic plate that is presensitized with a subtractive, negative-working, diazo-resin-based coating (NSSB from Precision Lithograining, South Hadley, Mass.). The plate samples were then placed in an oven at 120C. for 1 minute. Following, each sample was washed and sponged with the commercially available developer generally intended for use with this plate (Subtractive Developer SD-100 from Precision Lithograining). The portions of the plate coating to which drops of the test solutions had been applied were insoluble in the developer, whereas the coated areas not receiving drops were quantitatively dissolved away. All test solutions, A through G, appeared equally effective in insolubilizing the coating, and all produced good images with little apparent blooming when developed.

EXAMPLE 2

In a second experiment, drops of each of the seven test solutions A through G described in EXAMPLE 1 were applied separately to each of three test strips cut from a NSSB plate. The first test strip was developed using SD-100 without the prior application of heat. The second strip was heated in an oven for 1 minute at 100C. and then developed using SD-100. The third strip was heated in an oven for 2 minutes at 120C. and then developed using SD-100. The images developed were qualitatively evaluated by eye. The evaluations are listed in the following table.

| Test Solution | Plate strip developed without prior heating | Heated 1 minute at 100 C. | Heated 2 minutes at 120 C. |
|---|---|---|---|
| A | Poor | Good | Excellent |
| B | Poor | Good | Excellent |

-continued

| Test Solution | Plate strip developed without prior heating | Heated 1 minute at 100 C. | Heated 2 minutes at 120 C. |
|---|---|---|---|
| C | Poor | Good | Excellent |
| D | Good | Excellent | Excellent |
| E | Good | Excellent | Excellent |
| F | Good | Excellent | Excellent |
| G | Good | Excellent | Excellent |

EXAMPLE 3

In a third experiment, a test solution of 75% water and 25% isopropyl alcohol was prepared. To this solution was added 1% by weight sodium carbonate. Drops of this solution were applied to a commercially available plate presensitized with a solvent-borne diazo resin coating (LASTRA Presensitized Plate from Lastra of Sulmona, Italy). Drops of test solutions D, F, and 0 from EXAMPLE 1 were also applied to the solvent-borne coated plate. On visual examination of the plate after application of the drops, it appeared that while the isopropyl-containing test solution drops were absorbed by the plate, the drops of test solutions D, F, and G sat on top of the plate coating unabsorbed. The plate was placed in an oven at 120° C. for 1 minute and developed using DEV (LASTRA). An image was produced corresponding to the drops of the isopropyl-containing test solution, but no images were produced corresponding to the drops of the other test solutions. Without being bound by theory, it is believed that the lack of any co-solvent in the test solutions D, F, and G prevented these solutions from penetrating the solvent-borne coating and thus prevented the chemicals in solution from reacting with the diazo functional groups and insolubilizing the coating at the locations of the corresponding drops.

EXAMPLE 4

In a fourth experiment, five aqueous diazo coating solutions were made. The first diazo resin used, Diazo Resin A, is commercially available under the name DIAZON 7 from Molecular Rearrangement Inc. of Newton, NJ (MRI). By the condensation of 4-diazodiphenylaminebisulfate (commercially available under the name DIAZO S from MRI) with p-formaldehyde according to the procedures in U.S. Pat. No. 5,688,627 (Deutsch), the high (EXAMPLE 8 therein) and low (EXAMPLE 4 therein) molecular weight resins were made respectively named Diazo Resins B and C. Similarly, by the condensation of 3-methoxy-4-diazodiphenylamine bisulfate from MRI with p-formaldehyde Diazo D was made. Diazo E was made by the reaction of 3-methoxy-4-diazodiphenylamine with 4,4'-bismethoxymethyldiphenyl-ether both from MRI.

A master batch of coating solution was prepared by mixing the following ingredients:
Vinyl acetate-ethylene copolymer aqueous resin dispersion (55% solids) 12.5 g
  (Commercially available as AIRFLEX 400 from
  Air Products, Allentown, Pa.)
water 77.0 g
propylene glycol 2.5 g
copper phthalocyanine aqueous dispersion 2.9 g
  (Commercially available as LIQUIFLEX BR-2025 from Drew Graphics)
nonionic surfactant, 5% solution 0.02 g
  (Commercially available as TEGO WET 260 from Goldschmidt Chemicals)

This master batch of coating solution was divided into five equal parts. To each part was added 0.2 g of an above described diazo resin, A through E successively. Each dispersion was stirred and, using a #4 wire wound rod, coated onto a grained anodized silicated aluminum plate. The coatings were dried with hot air.

A strip was cut from each plate coated with a diazo coating solution, A through E, and to each strip was applied drops of test solutions A, D, F, and G from EXAMPLE 1 above. The strips were heated in an oven for 1 minute at 120C. and then developed with SD-100. The images developed were qualitatively evaluated by eye. The results are reported in the following table:

| Test Solutions | Diazo A | Diazo B | Diazo C | Diazo D | Diazo E |
|---|---|---|---|---|---|
| Solution A | Fair | Fair | None | None | None |
| Solution B | Excellent | Excellent | Excellent | Fair | Good |
| Solution C | Excellent | Excellent | Excellent | Excellent | Excellent |
| Solution D | None | None | None | None | None |

EXAMPLE 5

In a fifth experiment, a double layer coated plate was prepared from aqueous coating solutions. The first layer is an aqueous-borne diazo-sensitized coating enabling the plate to be imaged. The coating solution is prepared by mixing the following ingredients:

| | |
|---|---|
| Diazo Resin C (from Example 4) | 0.34 g |
| Water | 34.00 g |
| TEGOWET 260 | 0.8 g |

This solution was coated onto a grained anodized silicated aluminum plate using a #4 wire wound rod and dried with hot air.

The coating solution for the protective second layer was prepared by mixing the following ingredients:
Vinyl acetate-acrylic copolymer aqueous resin dispersion, 55% solids 5 g
  (Available commercially as GELVA TS-100 from Solutia, Springfield, MA)

| | |
|---|---|
| water | 27 g |
| LEQUAFLEX BR-2025 | 1.15 g |
| TEGOWET 260 | 0.04 g |

The solution was then coated onto the above-described plate having the aqueous-borne diazo coating and dried. Drops of test solutions A, D, F, and G from EXAMPLE 1 above were applied, and then the plate was heated and developed with SD-100. On visual observation, 19 test solutions D and F produced excellent images; solution A produced a fair image; and G produced no image.

EXAMPLE 6

A second double layer coated plate was prepared. The first layer was a solvent-borne photosensitizing coating comprising diazo resins. A 1% by weight solution of Diazo Resin BBP (available from MRI) in methyl cellosolve was prepared. The solution was coated onto to a grained anodized silicated aluminum plate and dried.

The second layer was formed using same second-layer solution as described in EXAMPLE 5, an aqueous-borne resin with pigment dispersion. After coating and drying, the plate was treated with drops of test solutions A, D, F, and G from EXAMPLE 1, heated, and developed. Judging by eye, solutions A, D, F, produced excellent images; G failed to produce any image.

EXAMPLE 7

A third double layer coated plate was tested. A plate was prepared with the same first layer coating as described in EXAMPLE 5, an aqueous-borne sensitizing diazo resin. The second layer coating solution was prepared from:

| | |
|---|---|
| BUTVAR B-76 (polyvinyl butyral resin from Solutia, Springfield, MA) | 2.5 g |
| BENZOPURPURIN 4B (from Aldrich, Milwaukee, WI) | .050 g |
| ethanol | 30 ml |

After coating and drying, the plate was treated with drops of test solutions D and F from EXAMPLE 1, heated, and developed with SD-100. Excellent images were produced by both test solutions.

EXAMPLE 8

Two plates with single layer solvent-borne coatings were prepared and tested. A solvent soluble diazo resin (Diazo F) was prepared by reacting Diazo B (from EXAMPLE 4) with 2-hydroxy-4-methoxybenzophenone-5-sulfonic acid. The first plate was coated with the following mixture:

| | |
|---|---|
| propylene carbonate | 15 g |
| ethanol | 11 g |
| EPON 1031 (a multifunctional epichlorohydrin/tetraphenol ethane epoxy resin from Shell Chemicals, Alanta, GA) | 2 g |
| Diazo F | 0.9 g |
| BENZOPURPURIN 4B | 0.115 g |

The second plate was coated with the following mixture:

| | |
|---|---|
| Ethanol | 12 g |
| Propylene carbonate | 6 g |
| Diazo F | 0.5 g |
| EPON 1031 | 1.13 g |
| VINAC B-15 (a polyvinyl acetate resin from McGean, Cleveland, OH) | 0.5 g |
| BENZOPURPURIN 4B | 0.133 g |

We claim:

1. A lithographic printing plate, consisting essentially of: a silicated anodized aluminum plate having a surface covered at least in part with a non-photosensitive coating applied directly to the plate, wherein apart of said coating defines an image by insolubility of said part in a developer, wherein said insoluble part contains a higher concentration of alkaline materials than the soluble part of said coating, and wherein said alkaline materials are responsible for changes in solubility of said coating.

2. A lithographic printing plate as claimed in claim 1, wherein the anodized silicated aluminum plate comprises a pained silicated anodized aluminum plate.

3. A lithographic printing plate as claimed in claim 1, wherein the non-photosensitive coating has a thickness of 1 to 3 microns.

4. A lithographic printing plate, comprising: an aluminum plate baying a surface covered at least in part with a coating which coating is at least in part made photosensitive by inclusion of diazo compounds, wherein a part of said coating defines an image by insolubility of said image in a developer, wherein said insoluble image contains a higher concentration of alkaline materials than the soluble portion of said coating, and wherein said alkaline materials are responsible for changes in solubility of said coating.

5. A lithographic printing plate as claimed in claim 4, wherein the substrate comprises an anodized aluminum plate.

6. A lithographic printing plate as claimed in claim 4, wherein the coating has a thickness of 1 to 3 microns.

* * * * *

UNITED STATES PATENT AND TRADEMARK OFFICE
CERTIFICATE OF CORRECTION

PATENT NO. : 6,796,235 B2
DATED : September 28, 2004
INVENTOR(S) : Deutsch et al.

It is certified that error appears in the above-identified patent and that said Letters Patent is hereby corrected as shown below:

<u>Column 12,</u>
Line 25, "pained" should be -- gained --.

Signed and Sealed this

Twenty-second Day of February, 2005

JON W. DUDAS
*Director of the United States Patent and Trademark Office*